(12) United States Patent
Cheng et al.

(10) Patent No.: US 9,263,123 B2
(45) Date of Patent: Feb. 16, 2016

(54) MEMORY DEVICE AND A METHOD OF OPERATING THE SAME

(71) Applicant: TAIWAN SEMICONDUCTOR MANUFACTURING COMPANY LTD., Hsinchu (TW)

(72) Inventors: Chiting Cheng, Taichung (TW); Chien-Kuo Su, Kaohsiung County (TW); Cheng Hung Lee, Hsinchu (TW); Jonathan Tsung-Yung Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 97 days.

(21) Appl. No.: 14/068,771

(22) Filed: Oct. 31, 2013

(65) Prior Publication Data

US 2015/0117094 A1 Apr. 30, 2015

(51) Int. Cl.

| | | |
|---|---|---|
| *G11C 11/00* | (2006.01) | |
| *G11C 11/419* | (2006.01) | |
| *G11C 11/413* | (2006.01) | |
| *H01L 27/11* | (2006.01) | |
| *G11C 5/14* | (2006.01) | |
| *G11C 16/30* | (2006.01) | |
| *G11C 7/02* | (2006.01) | |
| *G11C 8/08* | (2006.01) | |
| *G11C 11/418* | (2006.01) | |

(52) U.S. Cl.
CPC ............ *G11C 11/419* (2013.01); *G11C 5/14* (2013.01); *G11C 7/02* (2013.01); *G11C 8/08* (2013.01); *G11C 11/413* (2013.01); *G11C 11/418* (2013.01); *G11C 16/30* (2013.01); *H01L 27/11* (2013.01)

(58) Field of Classification Search
CPC .... H01L 27/11; G11C 11/413; G11C 11/419; G11C 8/08; G11C 5/14; G11C 16/30
USPC .............. 365/156, 189.011, 210.12, 226, 229
See application file for complete search history.

(56) References Cited

U.S. PATENT DOCUMENTS

| | | | | |
|---|---|---|---|---|
| 2011/0019463 | A1* | 1/2011 | Wang | 365/154 |
| 2012/0008449 | A1* | 1/2012 | Chuang et al. | 365/227 |
| 2012/0170390 | A1* | 7/2012 | Idgunji | G11C 7/222 |
| | | | | 365/194 |
| 2013/0077387 | A1* | 3/2013 | Yabuuchi | 365/154 |
| 2014/0328112 | A1* | 11/2014 | Riley | 365/154 |

* cited by examiner

*Primary Examiner* — Fernando Hidalgo
(74) *Attorney, Agent, or Firm* — WPAT, P.C.; Anthony King (57) ABSTRACT

A semiconductor memory device comprises an array of memory cells arranged in rows and columns, control lines coupled to the rows of memory cells for accessing the memory cells, conductive lines coupled to the rows of memory cells for powering the memory cells, and a control circuit configured to maintain non-selected conductive lines at a first voltage level and boost a selected conductive line to a second voltage level in an access operation, the second voltage level being higher than the first voltage level.

19 Claims, 6 Drawing Sheets

MEMORY DEVICE AND A METHOD OF OPERATING THE SAME

BACKGROUND

Static random access memory (SRAM) is a type of semiconductor memory device that uses bi-stable latching circuitry to store each bit. An SRAM cell includes storage nodes formed by cross-coupled inverters which are accessed through pass gates coupled to a bit line and a complementary bit line, respectively. An SRAM cell operating at a relatively low voltage may suffer disturbance during an access operation. Specifically, during a read cycle, the storage node storing a logical low value is charged by one of the bit line and the complementary bit line, and if a voltage of the storage node rises above a switching threshold of the inverter driven by the storage node, stored data is destroyed, an issue referred to as read disturbance. Further, during a write cycle, other cells in the same row as the SRAM cell experience read disturbance, and data in the other cells is potentially destroyed, an issue referred to as dummy read disturbance.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled with" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Figure 1:
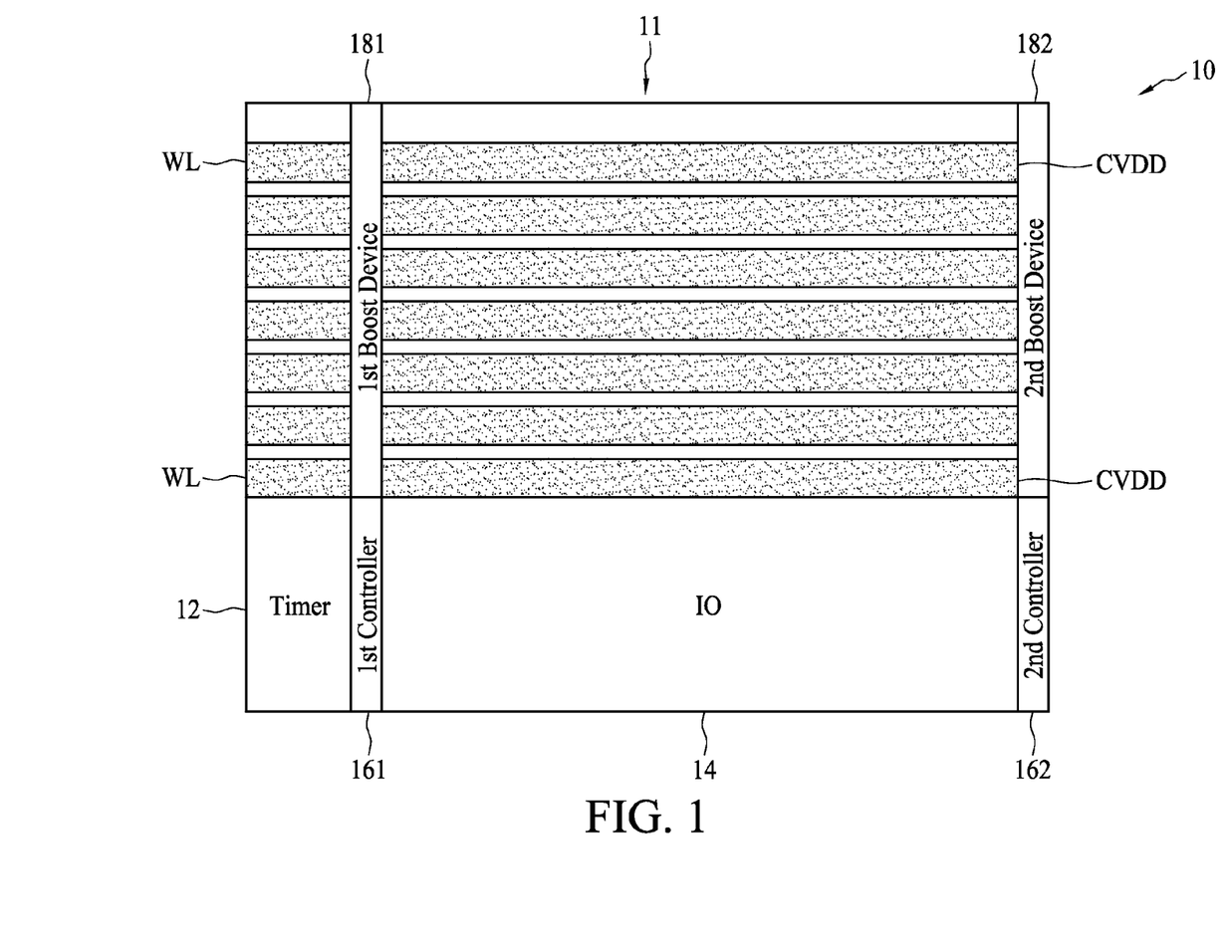
FIG. 1 is a schematic diagram of a memory device in accordance with some embodiments.

FIG. 1 is a schematic diagram of a memory device 10 in accordance with some embodiments. Referring to FIG. 1, memory device 10 includes a memory array 11, a timer 12, an input/output (I/O) section 14, a first controller 161, a first boost device 181, a second controller 162, and a second boost device 182.

Memory array 11 includes an array of memory cells (not shown) arranged in rows and columns. In some embodiments, the memory cells include but are not limited to static random access memory (SRAM) cells. The memory cells are powered by a power supply (not shown) providing a voltage VDD via conductive lines CVDD. In memory array 11, conductive lines CVDD of memory cells in a row are coupled together to a power supply. Moreover, the memory cells are accessible via word lines WL, which are arranged in the row direction. Effectively, during an access operation such as a read operation or a write operation, when a word line WL is selected, a conductive line CVDD in the row direction associated with the selected word line WL is selected so that a boost voltage can be applied thereto. Boosting conductive lines CVDD in the same direction as asserting word lines WL achieves more efficient power management than certain existing boost schemes. In such existing boost schemes, conductive lines in a column of a memory array are coupled together to a power supply. As such, during a boost period, all memory cells, including not only accessed cells but also not accessed cells, are boosted, resulting in less efficient management of power.

Timer 12 is configured to control the timing of an access operation, including the timing of boosting a selected conductive line CVDD in the row direction during read and write operations, and the timing of boosting a selected word line WL during a write operation. Timer 12 will be discussed in more detail with reference to FIG. 6.

I/O section 14 includes peripheral circuits that facilitate read and write operations. For example, I/O section 14 may include read sensing circuits and write driving circuits.

First controller 161 is configured to boost a selected row of memory cells to a nominal VDD level via a corresponding row of conductive lines CVDD. Moreover, first boost device 181 is coupled between first controller 161 and each row of conductive lines CVDD at one side of the memory array. As a result, a signal of nominal VDD is sent through first controller 161 and first boost device 181 to a selected row of memory cells during an access operation. First controller 161 and first boost device 181 will be further discussed with reference to FIG. 6.

Figure 6:
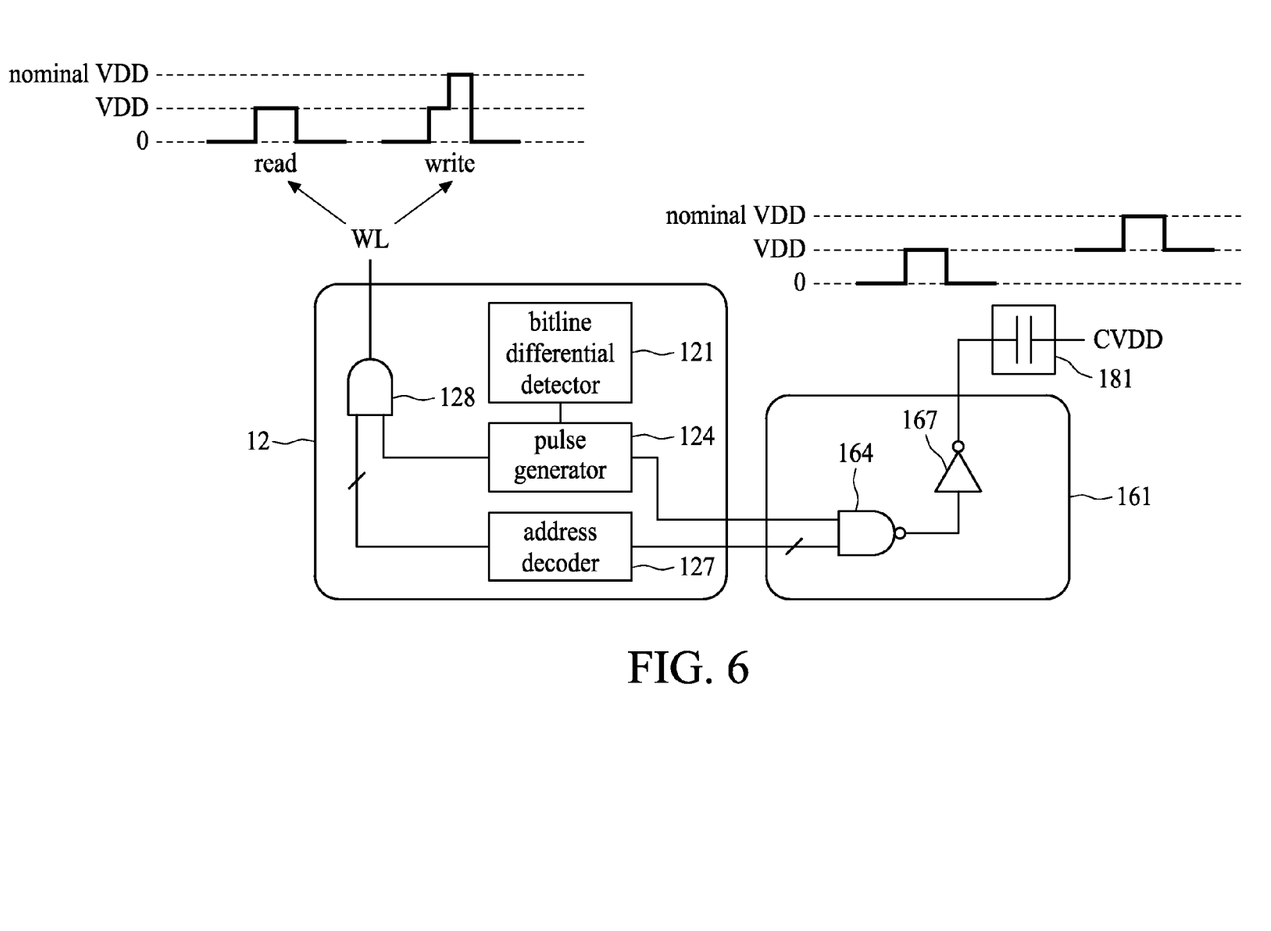
FIG. 6 is a schematic diagram of a control circuit in accordance with some embodiments.

Likewise, second controller 162 is configured to boost a selected row of memory cells to a nominal VDD level via a corresponding row of conductive lines CVDD. Moreover, second boost device 182 is coupled between second controller 162 and each row of conductive lines CVDD at another side of the memory array. As a result, a signal of nominal VDD is sent through second controller 162 and second boost device 182 to a selected row of memory cells during an access operation. Although memory device 10 as illustrated includes two boost controllers 161, 162 and their respective boost devices 181, 182, in some embodiments, however, one of first controller 161 and second controller 162 is optional, and accordingly the corresponding one of first boost device 181 and second boost device 182 is also optional.

Figure 2:
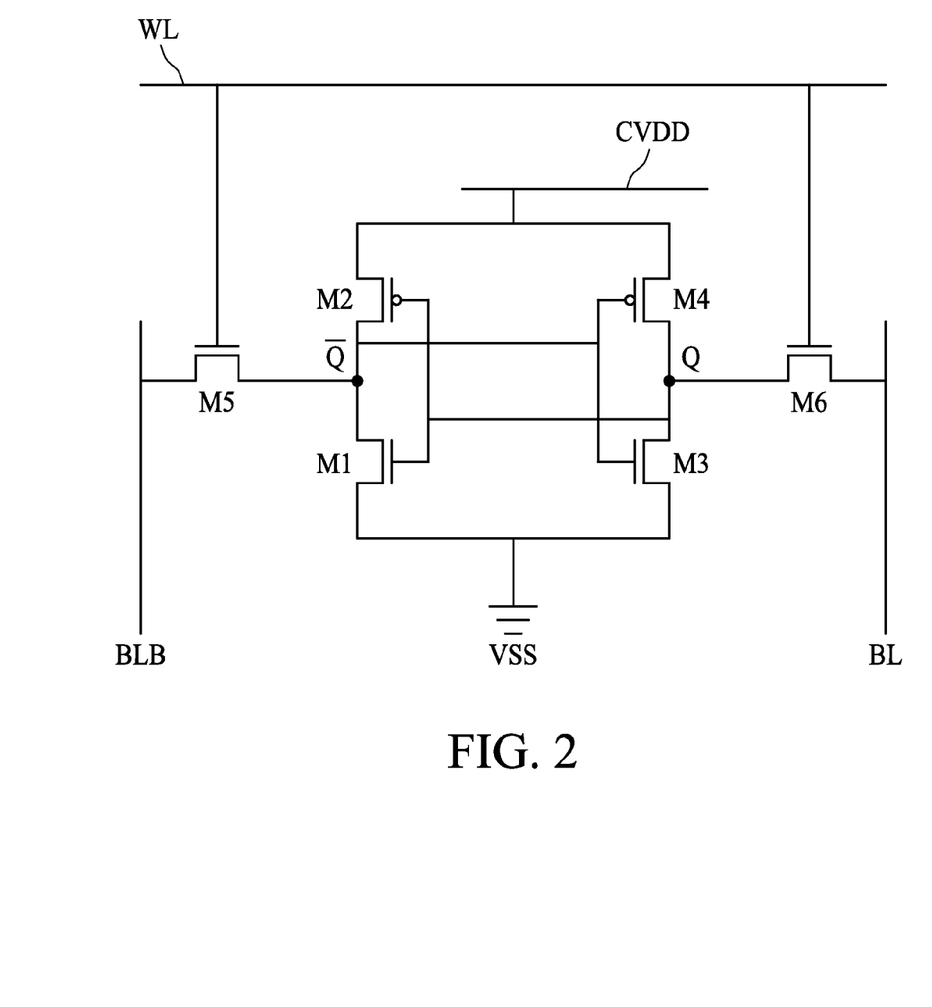
FIG. 2 is a circuit diagram of a memory cell in the memory device illustrated in FIG. 1.

FIG. 2 is a circuit diagram of a memory cell 20 in the memory device 10 illustrated in FIG. 1. Memory cell 20 includes but is not limited to a six-transistor (6T) SRAM structure. For example, memory cell 20 in some embodiments may use a 4T, 8T or 10T SRAM structure. Referring to FIG.

2, memory cell 20 includes a first inverter formed by transistors M1 and M2, a second inverter formed by transistors M3 and M4, and access transistors or pass gates M5 and M6.

The first and second inverters are cross coupled to each other to form a latching circuitry for data storage. A source of each of transistors M2 and M4 is coupled to a conductive line CVDD, while a source of each of transistors M1 and M3 is coupled to a reference voltage VSS, for example, ground.

A gate of pass gate M6 is coupled to a word line WL. A drain of pass gate M6 is coupled to a bit line BL. Moreover, a source of pass gate M6 is coupled to drains of transistors M4 and M3 and also to gates of M2 and M1.

Similarly, a gate of pass gate M5 is coupled to the word line WL. A drain of pass gate M5 is coupled to a complementary bit line BLB. Moreover, a source of pass gate M5 is coupled to drains of transistors M2 and M1 and also to gates of M4 and M3.

Memory cell 20 operates in three different modes: standby, reading and writing. In standby mode, memory cell 20 is idle and is not accessed. If the word line WL is not asserted, pass gates M5 and M6 disconnect memory cell 20 from bit lines BL and BLB. The cross-coupled inverters formed by transistors M1 to M4 function to reinforce each other as long as they are connected to a power supply.

Access to memory cell 20 is enabled by the word line WL, which controls pass gates M5 and M6 which, in turn, control whether memory cell 20 should be connected to bit lines BL and BLB. Assume that the content of memory cell 20 is a logical 0, stored at Q. A read cycle is started by precharging both the bit lines to a logical 1, then asserting the word line WL, enabling both pass gates M5 and M6. The second step occurs when the values stored in Q and $\overline{Q}$ are transferred to bit lines by leaving BLB at its precharged value and discharging BL through M6 and M3 to a logical 0. On the BLB side, transistors M2 and M5 pull bit line BLB toward VDD, a logical 1. If the content of memory cell is a logical 1, the opposite would happen and BL would be pulled toward 1 while BLB toward 0. Then these bit lines BL and BLB will have a small difference between them, which is sent to a sense amplifier (not shown) in I/O section 14. The sense amplifier senses which line has higher voltage and thus determines the content of memory cell 20.

As to the writing mode, a write cycle is started by applying a value to be written to bit lines BL and BLB. If a logical 0 is to be written, a logical 0 is applied to the bit lines by driving bit lines BLB to 1 and BL to 0 via a write driver (not shown) in I/O section 14. A logical 1 is written by inverting the values of bit lines BL and BLB. The word line WL is then asserted and the value that is to be stored is latched in.

In the reading mode, stored data at Q should be readable and should not be toggled. However, if memory cell 20 is maintained at VDD during a read cycle, cross-coupled inverters formed by transistors M1 to M4 may not be strong enough to ensure that the read disturbance issue does not occur. A method according to some embodiments of the present disclosure to address the issue will be described with reference to FIG. 3.

On the contrary, in the writing mode, stored data at Q should be easily toggled. Moreover, while updating the stored data, the cross-coupled inverters of other memory cells in the same row as memory cell 20 should be strong enough to ensure that the dummy read disturbance issue does not occur. A method according to some embodiments of the present disclosure to address the issue will be described with reference to FIG. 4.

Figure 3:
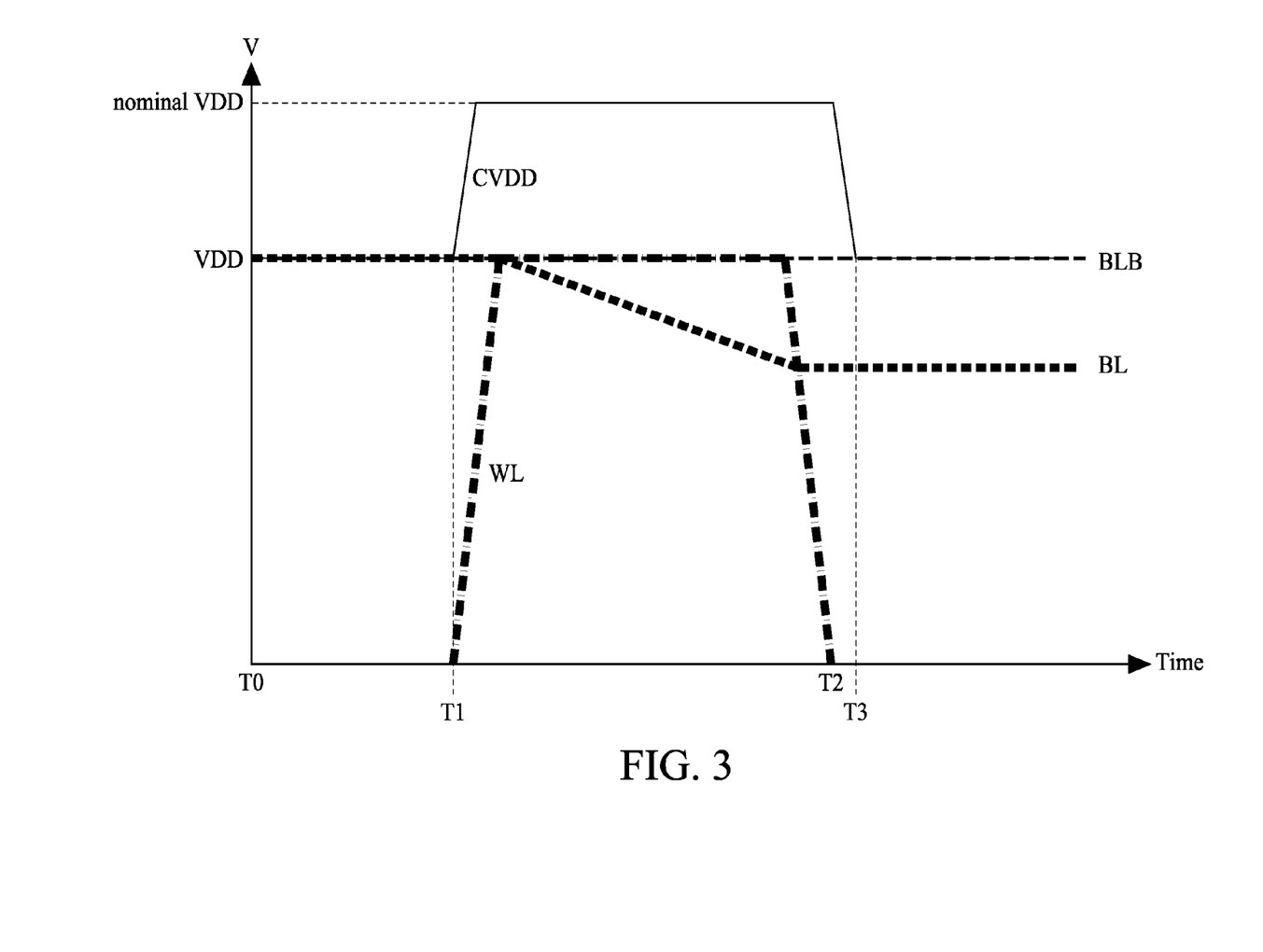
FIG. 3 is a graph of signal waveforms during a read cycle in accordance with some embodiments.

FIG. 3 is a graph of signal waveforms during a read cycle in accordance with some embodiments. Referring to FIG. 3, at time T0, bit lines BL (voltage waveform of which is shown in bold-dashed lines) and BLB (voltage waveform of which is shown in dashed lines) are precharged to VDD before word line WL is asserted. Moreover, memory cells in memory array 11 are connected to VDD via conductive lines.

At time T1, a selected word line WL (voltage waveform of which is shown in dotted-and-dashed lines) is asserted. The selected word line WL is connected to a row of memory cells via pass gates. Furthermore, a conductive line CVDD associated with the selected word line is boosted to a predetermined voltage level, nominal VDD. The selected conductive line CVDD is connected to the selected row of memory cells via pull-up transistors M2 and M4. Boosting the selected conductive line CVDD helps protect the selected row of memory cells from read disturbance during the read cycle. Meanwhile, cells in non-selected rows of memory array 11 are not boosted and are maintained at VDD. In some embodiments, the nominal VDD is approximately 0.85 volt (V), and VDD is approximately 70% of the nominal VDD.

Assume the stored data at Q at the BL side is 0. The bit line BL is discharged during the read cycle. Subsequently, at time T2 when the read cycle is finished, a voltage difference exists between the bit line BL discharged over time and the complementary bit line BLB that is substantially maintained at VDD.

At time T3, after the selected word line WL is deasserted, the boost operation is finished and the selected conductive line CVDD is maintained at VDD. In some embodiments, however, the boost operation and the read operation may be finished at the same time, T2.

Figure 4:
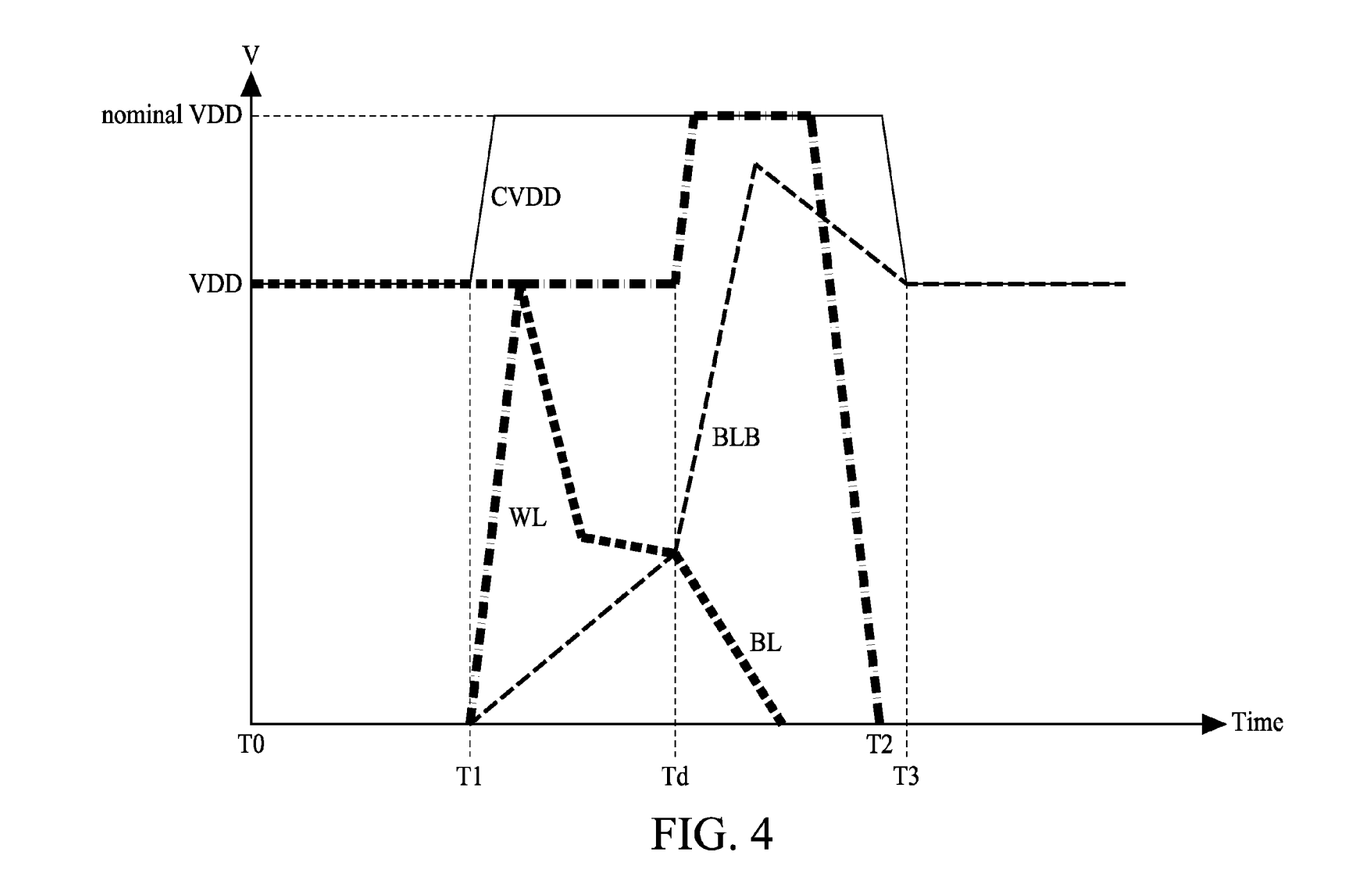
FIG. 4 is a graph of signal waveforms during a write cycle in accordance with some embodiments.

FIG. 4 is a graph of signal waveforms during a write cycle in accordance with some embodiments. Referring to FIG. 4, it is assumed that stored data at Q at the BL side is 1. At time T0, bit lines BL and BLB are maintained at 1 (VDD) and 0 (ground), respectively before word line WL is asserted. Moreover, memory cells in memory array 11 are connected to VDD via conductive lines.

At time T1, a selected word line WL is asserted and a selected conductive line CVDD associated with the selected word line is boosted to nominal VDD. Boosting the selected conductive line CVDD helps protect the selected row of memory cells from dummy read disturbance during the write cycle. Meanwhile, cells in non-selected rows of memory array 11 are not boosted and are maintained at VDD.

Bit lines BL and BLB change their states over time. Specifically, bit line BL changes from 1 to 0 while complementary bit line BLB changes from 0 to 1 during the write cycle. While boosting the selective conductive line CVDD alleviates dummy read disturbance, such boosting may in a sense hinder the stored data from toggling. To facilitate toggling, the selected word line WL is boosted to nominal VDD. As a result, to address the dummy read disturbance issue and ensure a successful toggling, boosting the selected word line WL is performed after boosting the selected conductive line CVDD. In some embodiments, when the difference between bit lines BL and BLB reaches a predetermined threshold, which is large enough to ensure toggling, the selected word line WL is boosted. In an embodiment, at time Td when bit lines BL and BLB are substantially equal to each other, the selected word line WL is boosted to nominal VDD.

At time T2, when the write cycle is finished, bit lines BL and BLB are toggled. Next, at time T3, after the selected word line WL is deasserted from nominal VDD, the boost operation for the selected conductive line CVDD is finished and the selected conductive line CVDD is maintained at VDD.

Figure 5:
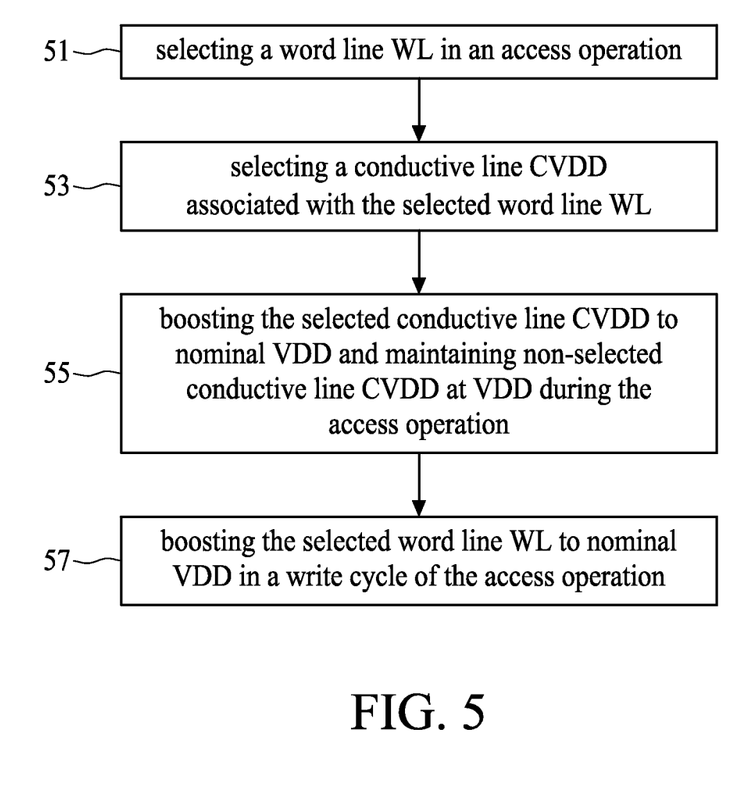
FIG. 5 is a flow diagram illustrating a method of operating the memory device illustrated in FIG. 1 in accordance with some embodiments.

FIG. 5 is a flow diagram illustrating a method of operating the memory device illustrated in FIG. 1 in accordance with some embodiments. Referring to FIG. 5, in operation 51, a word line WL is selected in an access operation, including a read operation or a write operation. The selected word line WL is connected to a row of memory cells in memory array 11.

In operation 53, a conductive line CVDD associated with the selected word line WL is selected. The selected conductive line CVDD is connected to the row of memory cells. Moreover, the remaining or non-selected conductive lines CVDD are connected to the remaining or non-selected rows of memory cell in memory array 11.

In operation 55, the selected conductive line CVDD is boosted to nominal VDD while the non-selected conductive lines CVDD are maintained at VDD during the access operation.

In operation 57, if a write operation is performed for the access operation, the selected word line WL is boosted to nominal VDD after the selected conductive line CVDD is boosted to nominal VDD.

FIG. 6 is a schematic diagram of a control circuit in accordance with some embodiments. The control circuit includes timer 12, first controller 161 and first boost device 181. In some embodiments, the control circuit further includes second controller 162 and second boost device 182. Second controller 162 and second boost device 182 schematically illustrated in FIG. 1 are similar to first controller 161 and first boost device 181, respectively, and thus are not further discussed.

Timer 12 includes a detector 121, a pulse generator 124 and an address decoder 127. Address decoder 127 is configured to assert one of at least one first selection line in response to the selection of a world line WL. The at least one first selection line is coupled to a first decision device 128, for example, an AND gate. Moreover, address decoder 127 is configured to assert one of at least one second selection line in response to the selection of a conductive line CVDD. The at least one second selection line is coupled to a second decision device 164, for example, a NAND gate in first controller 161.

Detector 121 is configured to detect whether the difference between bit lines BL and BLB associated with the selected word line WL reaches a predetermined threshold in a write operation. If affirmative, the selected word line WL is boosted. If not, the selected word line WL stays non-boosted during the write operation until the threshold is met. Detector 121 is also configured to send a signal to pulse generator 124, indicating a detection result.

Pulse generator 124 is configured to generate a first pulse signal of VDD for the selected word line WL during a read operation, and generate the first pulse signal of VDD for the selected word line WL during a first half of a write operation before the predetermined threshold is reached and a second pulse signal of nominal VDD for the selected word line WL during a second half of the write operation when the predetermined threshold is reached. A first output of pulse generator 124 is coupled to an input of first decision device 128. In response to signals from pulse generator 124 and address decoder 127, first decision device 128 sends a voltage signal to the selected word line WL for a desired operation during a read cycle and a write cycle.

Furthermore, pulse generator 124 is also configured to generate a first pulse signal of VDD for non-selected conductive lines CVDD during an access operation, and generate a second pulse signal of nominal VDD for the selected conductive line CVDD during the access operation. A second output of pulse generator 124 is coupled to an input of second decision device 164. In response to signals from pulse generator 124 and address decoder 127, second decision device 164 sends a voltage signal to the selected conductive line CVDD for a desired operation during the access operation.

First controller 161 further includes an inverter 167. An input of inverter 167 is coupled to an output of second decision device 164. An output of inverter 167 is coupled to one end of first boost device 181. The other end of first boost device 181 is coupled to each row of connective lines CVDD. In an embodiment, first boost device 181 includes a capacitor.

Embodiments of the present disclosure provide a method of operating a semiconductor memory device 10. The method comprises selecting a control line WL in an access operation, the control line coupled to a row of memory cells, selecting a conductive line CVDD associated with the selected control line, the conductive line coupled to the row of memory cells, and maintaining non-selected conductive lines at a first voltage level VDD and boosting the selected conductive line to a second voltage level nominal VDD during the access operation. The second voltage level is higher than the first voltage level.

Some embodiments of the present disclosure provide a method of operating a semiconductor memory device 10. The method comprises selecting a control line WL in an access operation, the control line coupled to a row of memory cells, asserting the selected control line at a first voltage level VDD in a first half (from time T1 to Td) of a write cycle of the access operation, and boosting the selected control line to a second voltage level nominal VDD in a second half (time between Td and T2) of the write cycle. The second voltage level is higher than the first voltage level.

Embodiments of the present disclosure also provide a semiconductor memory device 10. Semiconductor memory device 10 includes an array of memory cells 11 arranged in rows and columns, control lines WL coupled to the rows of memory cells for accessing the memory cells, conductive lines CVDD coupled to the rows of memory cells for powering the memory cells, and a control circuit (FIG. 6) configured to maintain non-selected conductive lines at a first voltage level VDD and boost a selected conductive line to a second voltage level nominal VDD in an access operation. The second voltage level is higher than the first voltage level.

In an embodiment, the control circuit includes a pulse generator 124 configured to generate a first pulse signal of the first voltage level for a selected control line during a read cycle of the access operation. Moreover, pulse generator 124 is configured to generate the first pulse signal of the first voltage level for the selected control line during a first half of the write cycle, and a second pulse signal of the second voltage level for the selected control line during a second half of the write cycle.

In another embodiment, the control circuit includes a pulse generator 124 configured to generate a first pulse signal of the first voltage level for the non-selected conductive lines during the access operation, and generate a second pulse signal of the second voltage level for the selected conductive line during the access operation.

In yet another embodiment, the control circuit includes a detector 121 configured to detect whether a difference between a data line BL and a complementary data line BLB reaches a predetermined threshold. The control circuit is configured to maintain a selected control line at the first voltage level if the difference does not reach the predetermined threshold. Moreover, the control circuit is configured to boost a selected control line WL to the second voltage level if the difference reaches the predetermined threshold.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A method of operating a semiconductor memory device, the method comprising:
    selecting a control line in an access operation, the control line coupled to a row of memory cells;
    selecting a conductive line associated with the selected control line, the conductive line coupled to the row of memory cells;
    maintaining non-selected conductive lines at a first voltage level and boosting the selected conductive line to a second voltage level during the access operation, the second voltage level being higher than the first voltage level; and
    asserting the selected control line at the first voltage level when boosting the selected conductive line to the second voltage level.

2. The method of claim 1, wherein the access operation includes a read operation, further comprising:
    determining a content of the semiconductor memory device by sensing voltages of a data line and a complementary data line.

3. The method of claim 1, wherein the access operation includes a write operation, further comprising:
    identifying whether a difference between a data line and a complementary data line reaches a threshold; and
    boosting the selected control line to the second voltage level when the difference reaches the threshold.

4. The method of claim 3 further comprising maintaining the selected control line at the first voltage level when the difference does not reach the threshold.

5. The method of claim 3, wherein the threshold is reached when the data line and the complementary data line have the same voltage level.

6. A method of operating a semiconductor memory device, the method comprising:
    selecting a control line in an access operation, the control line coupled to access transistors of a row of memory cells;
    asserting the selected control line at a first voltage level to turn on a first access transistor and a second access transistor of a memory cell in a first half of a write cycle of the access operation;
    boosting the selected control line to a second voltage level to turn on the first access transistor and the second access transistor of the memory cell in a second half of the write cycle, the second voltage level being higher than the first voltage level; and
    selecting a conductive line associated with the selected control line, the conductive line coupled to the row of memory cells; and maintaining non-selected conductive lines at the first voltage level and boosting the selected conductive line to the second voltage level during the access operation.

7. The method of claim 6, wherein boosting the selected control line further comprises:
    identifying whether a difference between a data line and a complementary data line reaches a threshold; and
    boosting the selected control line to the second voltage level when the difference reaches the threshold.

8. The method of claim 7, wherein the threshold is reached when the data line and the complementary data line have the same voltage level.

9. A semiconductor memory device, comprising:
    an array of memory cells arranged in rows and columns;
    control lines coupled to the rows of memory cells for accessing the memory cells;
    conductive lines coupled to the rows of memory cells for powering the memory cells; and
    a control circuit configured to maintain non-selected conductive lines at a first voltage level and boost a selected conductive line to a second voltage level in an access operation, and to assert a selected control line at the first voltage level when boosting the selected conductive line to the second voltage level, the second voltage level being higher than the first voltage level.

10. The semiconductor memory device of claim 9, wherein the control circuit includes a pulse generator configured to generate a first pulse signal of the first voltage level for the selected control line during a read cycle of the access operation.

11. The semiconductor memory device of claim 10, wherein the pulse generator is configured to generate the first pulse signal of the first voltage level for the selected control line during a first half of the write cycle, and a second pulse signal of the second voltage level for the selected control line during a second half of the write cycle.

12. The semiconductor memory device of claim 9, wherein the control circuit includes a pulse generator configured to generate a first pulse signal of the first voltage level for the non-selected conductive lines during the access operation, and generate a second pulse signal of the second voltage level for the selected conductive line during the access operation.

13. The semiconductor memory device of claim 9, wherein the control circuit includes a detector configured to detect whether a difference between a data line and a complementary data line reaches a predetermined threshold.

14. The semiconductor memory device of claim 13, wherein the control circuit is configured to maintain the selected control line at the first voltage level if the difference does not reach the predetermined threshold.

15. The semiconductor memory device of claim 13, wherein the control circuit is configured to boost the selected control line to the second voltage level if the difference reaches the predetermined threshold.

16. The semiconductor memory device of claim 13, wherein the threshold is reached when the data line and the complementary data line have the same voltage level.

17. The semiconductor memory device of claim 9, wherein the control circuit includes an address decoder configured to assert one of at least one selection line in response to the selection of one of the control lines.

18. The semiconductor memory device of claim 9, wherein the control circuit includes an address decoder configured to assert one of at least one selection line in response to the selection of one of the conductive lines.

19. The semiconductor memory device of claim 9, wherein the control circuit includes a capacitor coupled to each row of the conductive lines.

* * * * *